United States Patent
Tanabe et al.

(10) Patent No.: US 9,903,044 B2
(45) Date of Patent: Feb. 27, 2018

(54) SILICON SINGLE CRYSTAL PRODUCING METHOD

(71) Applicant: SUMCO CORPORATION, Tokyo (JP)

(72) Inventors: Kazumi Tanabe, Tokyo (JP); Takashi Yokoyama, Tokyo (JP); Tegi Kim, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 15/030,706

(22) PCT Filed: Oct. 31, 2014

(86) PCT No.: PCT/JP2014/005528
§ 371 (c)(1),
(2) Date: Apr. 20, 2016

(87) PCT Pub. No.: WO2015/068370
PCT Pub. Date: May 14, 2015

(65) Prior Publication Data
US 2016/0251774 A1  Sep. 1, 2016

(30) Foreign Application Priority Data
Nov. 5, 2013  (JP) .................................. 2013-229088

(51) Int. Cl.
*C30B 15/20* (2006.01)
*C30B 29/06* (2006.01)
(Continued)

(52) U.S. Cl.
CPC .............. *C30B 15/20* (2013.01); *C30B 15/04* (2013.01); *C30B 15/14* (2013.01); *C30B 27/02* (2013.01); *C30B 29/06* (2013.01)

(58) Field of Classification Search
CPC combination set(s) only.
See application file for complete search history.

(56) References Cited

U.S. PATENT DOCUMENTS 5,476,065 A * 12/1995 Ikezawa .................. C30B 15/00
                                                                            117/13
5,730,799 A *  3/1998 Ito ........................... C30B 15/00
                                                                            117/13

FOREIGN PATENT DOCUMENTS

JP          10-167881         6/1998
JP         2000-203985        7/2000
(Continued)

OTHER PUBLICATIONS

Search Report issued in PCT/JP2014/005528, dated Feb. 3, 2015.
Office Action issued in China Counterpart Patent Appl. No. 201480059891.6, dated Oct. 17, 2017.

*Primary Examiner* — Duy Vu N Deo
*Assistant Examiner* — Erin F Bergner
(74) *Attorney, Agent, or Firm* — Greenblum & Bernstein, P.L.C.

(57) ABSTRACT

There is provided a silicon single crystal producing method in producing a silicon single crystal by the Czochralski method using a pulling apparatus including a heat shield, wherein an oxygen concentration in the crystal is controlled through the adjustment of a flow velocity of inert gas introduced into the apparatus at the gap portion between an exterior surface of the single crystal and a lower-end opening edge of the heat shield, in accordance with a gap-to-crystal-diameter ratio ("the area of the gap portion"/"the area of a cross-sectional of the single crystal"). By this producing method, it is possible to appropriately control the oxygen concentration in the pulled single crystal.

6 Claims, 2 Drawing Sheets

(51) Int. Cl.
*C30B 15/14* (2006.01)
*C30B 15/04* (2006.01)
*C30B 27/02* (2006.01)

(56) References Cited

FOREIGN PATENT DOCUMENTS

KR  10-2002-0019000  3/2002
KR  10-2005-0041438  5/2005
KR  10-0558156  2/2006

* cited by examiner

FIG. 1
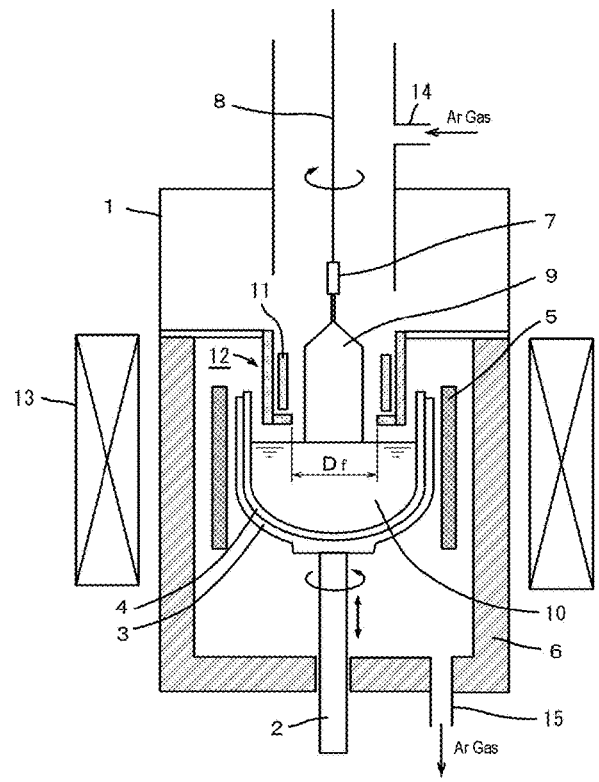
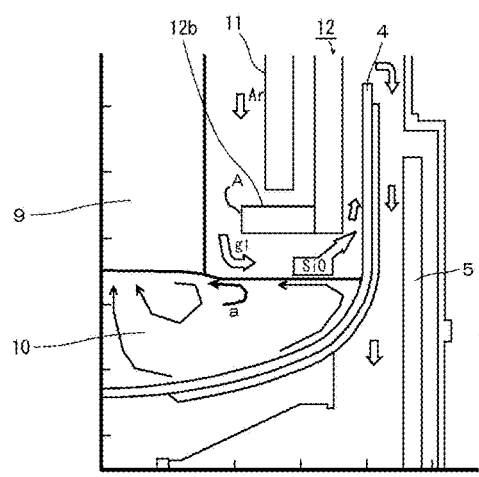
Fig. 2(a)
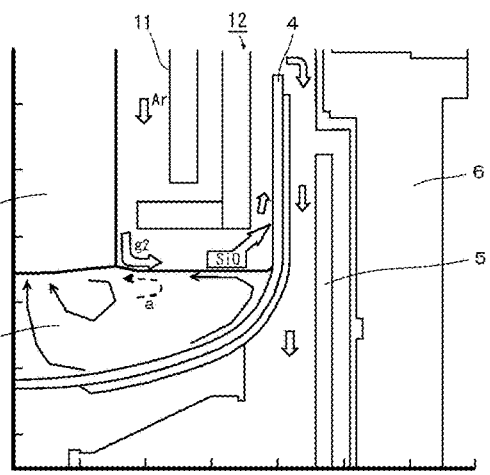
Fig. 2(b)

SILICON SINGLE CRYSTAL PRODUCING METHOD

TECHNICAL FIELD

The present invention relates to a method for producing a silicon single crystal by the Czochralski method, and in particular relates to a silicon single crystal producing method that enables appropriate control of an oxygen concentration in a crystal.

BACKGROUND ART

As a method for producing a silicon single crystal used for a semiconductor material, the Czochralski method (CZ method) has been widely employed. The Czochralski method is a method in which a seed crystal is dipped into and pulled upward from silicon that is melted in a quartz crucible to make a single crystal grow from the lower end of the seed crystal.

When a silicon single crystal is grown by this method, oxygen contained in the quartz crucible is dissolved in the molten silicon, and part of the oxygen is incorporated into the single crystal. Such oxygen causes a precipitate, a dislocation loop, and a stacking fault, in a heat treatment process to produce a device using a wafer cut from the silicon single crystal. Such defects have various influences on the quality of the single crystal, and appropriately controlling the concentration of oxygen to be incorporated into a single crystal is considered to be indispensable for producing a silicon single crystal with high quality.

As mentioned above, since the oxygen incorporated into the silicon single crystal during the growth of the single crystal has various influences on the quality of the single crystal, it is necessary to properly control the oxygen concentration in the single crystal. A problem about the oxygen concentration in the silicon single crystal is in particular variations in oxygen concentration in a single crystal in a growth axis direction. The oxygen concentration is influenced by various factors, and the influences of these factors change as the pulling of the crystal proceeds. For this reason, the homogeneity of the oxygen concentration in a single crystal in a growth axis direction cannot be secured, resulting in a decreased yield in producing a silicon single crystal that has a narrow required range of oxygen concentration specifications between an upper limit value and a lower limit value.

To secure the homogeneity of oxygen concentration in this silicon single crystal in a growth axis direction, for example, Patent Literature 1 discloses a pulling method for a single crystal in which the position of the bottom surface of a quartz crucible (a melt surface level) is moved up or down in accordance with the heat distribution property of a heater and a pulling length of the single crystal, and at the same time the flow velocity of inert gas introduced into an apparatus is controlled. Patent Literature 1 describes that, according to the single crystal pulling method, it is possible to obtain a silicon single crystal that has a desired oxygen concentration and a uniform axis direction oxygen distribution.

CITATION LIST

Patent Literature

Patent Literature 1: Japanese Patent Application Publication No. 10-167881

SUMMARY OF INVENTION

Technical Problem

In the pulling method for a silicon single crystal described in Patent Literature 1, an apparatus is used that includes a flow regulating barrel in an inverted truncated-cone shape, the flow regulating barrel being so attached thereto as to surround a pulled single crystal. However, important factors in controlling an inert gas flow velocity include the flow rate of the inert gas introduced into the apparatus, as well as the cross-sectional area of a gap portion between the exterior surface of the pulled single crystal and the lower-end opening edge of the flow regulating barrel (i.e., a portion through which inert gas passes); but the cited Patent Literature 1 has no description about this gap portion cross-sectional area, and the influence of the gap portion cross-sectional area on an oxygen concentration.

An object of the present invention, which has been made in such circumstances, is to provide a silicon single crystal producing method that enables appropriate control of the oxygen concentration in a single crystal in a growth axis direction.

Solution to Problem

It was found that changing a gap-to-crystal-diameter ratio causes the profile of the oxygen concentration in a crystal growth axis direction to vary; the gap-to-crystal-diameter ratio is a value obtained by dividing the area of a gap portion between the exterior surface of a single crystal and the lower-end opening edge of a heat shield (a portion through which inert gas passes) by the area of the cross section of the single crystal perpendicular to a pulling axis. This would be because of changes in relation between the flow velocity of the inert gas, which passes between the pulled single crystal and the lower-end opening edge of the heat shield, and the oxygen concentration in the silicon single crystal. Thus, the influence of an inert gas flow velocity on the oxygen concentration in a silicon single crystal was investigated. As a result, it was found that the influence of an inert gas flow velocity on the oxygen concentration in a single crystal differs in accordance with the gap-to-crystal-diameter ratio.

In other words, it has been considered that an increase in inert gas flow velocity promotes the volatilization of oxygen dissolved in silicon melt as SiO, which increases the amount of removed oxygen so as to reduce the oxygen concentration in the vicinity of a free surface of a melt, resulting in the reduction of the oxygen concentration in a silicon single crystal (i.e., there is a negative correlation between the inert gas flow velocity and the oxygen concentration). However, as a result of the investigation, it was found that, depending on the ratio of the area of the gap portion between the pulled single crystal and the heat shield to the single crystal cross-sectional area, the oxygen concentration in a silicon single crystal may be increased as the inert gas flow velocity increases (i.e., a positive correlation may be recognized between the inert gas flow velocity and the oxygen concentration).

The present invention is made on the basis of such a result of study, the gist of which is a silicon single crystal producing method described below.

That is, the silicon single crystal producing method is a method for producing a silicon single crystal by the Czochralski method in which a single crystal pulling apparatus is used, the single crystal pulling apparatus including a heat shield that is so disposed around a silicon single crystal, which is being pulled, as to be concentric with a pulling axis, wherein an oxygen concentration in the crystal is controlled through adjustment, in accordance with a gap-to-crystal-diameter ratio, of a flow velocity of inert gas introduced into the single crystal pulling apparatus at a gap portion between an exterior surface of the single crystal and a lower-end opening edge of the heat shield, the gap-to-crystal-diameter ratio being obtained by dividing the area of the gap portion by the area of a cross section perpendicular to the pulling axis of the single crystal.

The term "gap-to-crystal-diameter ratio" refers to a value that is obtained, as described above, by dividing the area of the gap portion between the exterior surface of the single crystal and the lower-end opening edge of the heat shield by the area of the cross section perpendicular to the pulling axis of the single crystal. Here, the "lower-end opening edge of the heat shield" refers to a portion of the heat shield closest to a central axis in the opening of the heat shield and, for example, refers to the edge of a lower end 12b of the heat shield in FIG. 2(a) to be described later portion with reference character A). Describing an example of the gap-to-crystal-diameter ratio with specific numerical values, when the diameter of the pulled single crystal is 310 mm, and the opening diameter of the heat shield is 355 mm, the cross-sectional area of the single crystal is 754.8 cm$^2$, the area of the opening of the heat shield is 989.8 cm$^2$, and thus the area of the gap portion between the exterior surface of the single crystal and the lower-end opening edge of the heat shield is expressed as (989.8–754.8) cm$^2$, and thus Gap-to-crystal-diameter ratio=(989.8−754.8)/ 754.8=0.31.

In the silicon single crystal producing method according to the present invention, the oxygen concentration in the crystal can be controlled through the flow velocity adjustment of the inert gas, on the basis that when the gap-to-crystal-diameter ratio is 0.27 to 0.45, an inert gas flow velocity at the gap portion between the single crystal and the heat shield, and the oxygen concentration in the crystal have a negative correlation, and when the gap-to-crystal-diameter ratio is 0.72 to 0.92, the inert gas flow velocity at the gap portion and the oxygen concentration in the crystal have a positive correlation.

For example, to reduce the oxygen concentration in a growing crystal, the inert gas flow velocity at the gap portion between the single crystal and the heat shield is increased when the gap-to-crystal-diameter ratio is 0.27 to 0.45, and decreased when the gap-to-crystal-diameter ratio is 0.72 to 0.92, which enables an appropriate control of the oxygen concentration in the crystal.

In addition, it is possible to appropriately control the oxygen concentration in the crystal by changing the inert gas flow velocity in accordance with a change in gap-to-crystal-diameter ratio attendant on the change in the diameter. This is particularly effective when the gap-to-crystal-diameter ratio is 0.27 to 0.45.

In the silicon single crystal producing method according to the present invention, when the single crystal is pulled, assuming that the adjustment of the flow velocity of inert gas at the gap portion is performed in stages in the pulling on the basis of the relation between the inert gas flow velocity at the gap portion that is calculated in advance in accordance with the gap-to-crystal-diameter ratio, and the oxygen concentration in the crystal, it is possible to control the oxygen concentration in the crystal regardless of the type of pulling apparatus or the like, ensuring homogeneity of the oxygen concentration of the single crystal in a growth axis direction.

According to the silicon single crystal producing method according to the present invention, it is possible to easily grow a single crystal having a uniform oxygen concentration in a crystal growth axis direction.

The silicon single crystal grown by the silicon single crystal producing method according to the present invention may be a crystal having such a diameter that enables a large diameter silicon wafer having a diameter of 300 mm or more to be cut.

Advantageous Effects of Invention

According to the silicon single crystal producing method according to the present invention, it is possible to appropriately control an oxygen concentration in a pulled silicon single crystal to ensure homogeneity of the oxygen concentration of the single crystal in a growth axis direction. In addition, the method is sufficiently applicable to producing a silicon single crystal from which a large-diameter silicon wafer having a diameter of 300 mm or more can be cut.

BRIEF DESCRIPTION OF DRAWINGS

FIG. 1 is a diagram schematically illustrating a general configuration example of a main part of a pulling apparatus that is suitable for implementing the silicon single crystal producing method according to the present invention.

FIGS. 2(a) and 2(b) are diagrams illustrating a result of a study about inert gas flow velocities at portions in a single crystal pulling apparatus with a gap-to-crystal-diameter ratio changed, through numerical simulations, wherein FIG. 2(a) illustrates the case of the gap-to-crystal-diameter ratio of 0.86, and FIG. 2(b) illustrates the case of the gap-to-crystal-diameter ratio of 0.37.

DESCRIPTION OF EMBODIMENTS

Figure 3:
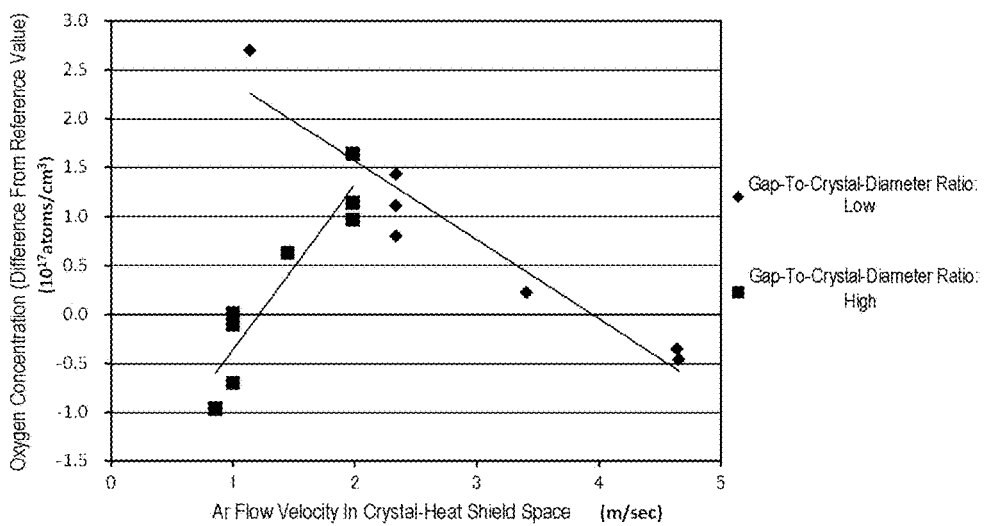
FIG. 3 is a diagram illustrating a relation between an inert gas (Ar) flow velocity in a crystal-heat shield space and an oxygen concentration in a pulled single crystal, for cases where the gap-to-crystal-diameter ratio is low and high.

The silicon single crystal producing method according to the present invention is, as described above, a method premised on the use of a single crystal pulling apparatus including a heat shield disposed around a silicon single crystal, which is being pulled, wherein an oxygen concentration in the crystal is controlled by the adjustment of an inert gas flow velocity (the flow velocity of inert gas at a gap portion between the exterior surface of the single crystal and the lower-end opening edge of the heat shield) in accordance with a gap-to-crystal-diameter ratio.

There will be described controlling an oxygen concentration in a crystal by the adjustment of the inert gas flow velocity in accordance with the gap-to-crystal-diameter ratio, with reference to the accompanying drawings.

FIG. 1 is a diagram schematically illustrating a general configuration example of a main part of a pulling apparatus that is suitable for implementing the silicon single crystal producing method according to the present invention. As illustrated, the pulling apparatus includes a chamber 1, a support shaft 2 that is provided being vertically upward and penetrating a center of a bottom portion of the chamber 1 and that can be moved up and down and can be rotated, a susceptor 3 that is fixed on an upper-end portion of the support shaft 2, a quartz crucible 4 that is housed inside the susceptor 3, and a heater 5 and an insulator 6 that are provided around the susceptor 3, and on the central axis of the quartz crucible 4, there are provided a seed holder 7 for retaining a seed crystal, and a pulling wire 8 for suspending and pulling the seed holder 7.

Furthermore, a forced cooling member 11 is so disposed concentrically with a pulling axis as to surrounding a growing silicon single crystal 9, and a heat shield 12 is so disposed concentrically with the pulling axis as to face the outer circumferential face and the lower-end face of the forced cooling member 11. In addition, in this example, a magnetic field applying device 13 is provided outside of the insulator 6.

Above the chamber 1, there is provided a gas inlet 14 for introducing Ar gas as inert gas into the chamber 1. In the vicinity of the gas inlet 14, a mass flow meter (not illustrated) is provided. With the mass flow meter, the flow rate (the volume velocity) of the Ar gas introduced into the chamber 1 of the pulling apparatus can be measured as a volume per unit time at the standard temperature and pressure (0° C., 1 atmospheric pressure). Below the chamber 1, there is provided a gas outlet 15 for discharging the Ar gas.

To implement the silicon single crystal producing method according to the present invention using the pulling apparatus configured in such a manner, a silicon material is first charged into the quartz crucible 4, heated in an Ar gas atmosphere to form a silicon melt 10. Next, the seed crystal retained by the seed holder 7 is dipped into the silicon melt 10 and gradually pulled upward with the seed crystal and the quartz crucible 4 rotated as appropriately so as to make a single crystal grow.

FIGS. 2(a) and 2(b) are diagrams illustrating the result of a study about inert gas flow velocities at portions in the single crystal pulling apparatus with the gap-to-crystal-diameter ratio changed, through numerical simulations, wherein FIG. 2(a) illustrates a case of a gap-to-crystal-diameter ratio of 0.86, and FIG. 2(b) illustrates a case of a gap-to-crystal-diameter ratio of 0.37. The other conditions are the same between FIG. 2(a) and FIG. 2(b). For convenience sake, FIGS. 2(a) and 2(b) illustrate the right half of a vertical section along a single crystal pulling axis.

As illustrated in FIGS. 2(a) and 2(b), the forced cooling member 11 is disposed around the single crystal 9 pulled from the silicon melt 10 in the quartz crucible 4, and the heat shield 12 is so disposed as to surround the forced cooling member 11.

As illustrated by arrows outline with blanks inside in the drawing, the inert gas (Ar) introduced into the apparatus passes between the single crystal 9 and the forced cooling member 11, passes thereafter through the gap portion between the exterior surface of the single crystal 9 and the lower-end opening edge of the heat shield 12 (the edge of the lower end of the heat shield 12 (a portion with reference character A)), passes between the lower-end face of the heat shield 12 and the silicon melt 10, flows upward along the internal surface of the quartz crucible 4, exits outside the crucible 4, descends thereafter inside (partly outside) the heater 5 along the exterior surface of the crucible 4, and is discharged through the gas outlet 15 (see FIG. 1).

In FIGS. 2(a) and 2(b), "SiO" added in the arrows outline with blanks inside on the surface of the silicon melt 10 indicates that part of oxygen dissolved from the quartz crucible 4 in the silicon melt 10 volatilizes as a SiO and is removed by the inert gas flow. In addition, arrows illustrated in the silicon melt 10 indicate directions of melt flows, the solid one illustrating a strong flow, and the broken one illustrating a weak flow.

Comparing FIG. 2(a) and FIG. 2(b), the gap portion in FIG. 2(a) between the exterior surface of the single crystal 9 and the lower-end opening edge of the heat shield 12 (the surface with reference character A) is wide as compared in FIG. 2(b), which makes an Ar gas flow velocity at the gap portion relatively low, and a large portion of the Ar gas having passed through the gap portion passes, as illustrated by an arrow g1 outline with blank inside, between the lower-end face of the heat shield 12 and the surface of the silicon melt 10 (slightly closer to the melt surface). The Ar gas does not reach the surface of the silicon melt 10 in the vicinity of a crystal growth meniscus. In contrast to this, the gap portion in FIG. 2(b) is narrow, which makes the Ar gas flow velocity relatively high, and a large portion of the Ar gas having passed through the gap portion reaches, as illustrated by an arrow g2 outline with blank inside, the proximity to the surface of the silicon melt 10 in the vicinity of the crystal growth meniscus, and thereafter passes the vicinity to the surface of the silicon melt 10. For this reason, it is considered that more oxygen is removed as SiO in FIG. 2(b) than in FIG. 2(a).

Furthermore, a difference is also found in a silicon melt flow: rolling convection in the silicon melt (convection with an arrow "a" in the silicon melt) is weak in FIG. 2(b) as compared in FIG. 2(a). The vicinity of a free surface of the silicon melt where this rolling convection occurs is a portion that has by nature the lowest oxygen concentration in the silicon melt because oxygen is removed there as SiO, and moreover, melt forming rolling convection is positioned directly below the single crystal growth meniscus and easily incorporated into the single crystal, and it is thus hypothesized that the strength of rolling convection causes a difference in oxygen concentration in a silicon single crystal.

The difference in the flow velocity distribution of inert gas flow described above is caused by the difference in opening diameter of the heat shield (in other words, the difference in width of a channel of inert gas). Thus, the gap-to-crystal-diameter ratio was introduced as an index for the gas passage between the exterior surface of the single crystal and the lower-end opening edge of the heat shield, and concentrations of oxygen incorporated into the single crystal were measured for the case of FIG. 2(a) (the gap-to-crystal-diameter ratio=0.86) and the case of FIG. 2(b) (the gap-to-crystal-diameter ratio=0.37) in such a manner as to pull a single crystal while changing the inert gas (Ar) flow velocities in a space (a gas passage) between the exterior surface of the pulled single crystal and the lower-end opening edge of the heat shield and a space (a gas passage) between the lower-end face of the heat shield 12 and the silicon melt surface.

As a result, as will be described later in Examples, it was found that the gap-to-crystal-diameter ratio=0.37 (FIG. 2(b)) results in a negative correlation in which the oxygen concentration in the silicon single crystal is reduced with an increase in inert gas flow velocity, and the gap-to-crystal-diameter ratio=0.86 (FIG. 2(a)) results in a positive correlation in which the oxygen concentration in the silicon single crystal increases with an increase in inert gas flow velocity.

Furthermore, as a result of a study through numerical simulations under different conditions, it was confirmed through the determination on the basis of the flow velocity distribution state of the inert gas flow that a gap-to-crystal-diameter ratio ranging from 0.27 to 0.45 results in a negative correlation between the inert gas flow velocity and the oxygen concentration in the silicon single crystal, and a gap-to-crystal-diameter ratio in the range of 0.72 to 0.92 results in a positive correlation between the inert gas flow velocity and the oxygen concentration in the silicon single crystal. At a gap-to-crystal-diameter ratio in the range of more than 0.45 and less than 0.72, no clear correlation was confirmed between the inert gas flow velocity and the oxygen concentration in the silicon single crystal.

It is considered here that the negative correlation is also present when the gap-to-crystal-diameter ratio is less than 0.27, but the gap with the crystal is too narrow in this case, which poses the risk of contact between the crystal and the heat shield in the pulling, as well as the problem in the control and measurement. In addition, it is considered that the positive correlation is also present when the gap-to-crystal-diameter ratio is more than 0.92, but in this case, a temperature gradient of the free surface of the melt cannot be made large, which is considered to deteriorate the controllability of pulling speed for growing silicon single crystal having no (few) defects. However, the lower limit value or the upper limit value of an appropriate gap-to-crystal-diameter ratio depends to a large degree on the whole balance of the pulling apparatus and may vary according to apparatuses.

Conceivable models for the reduction in oxygen concentration in a silicon single crystal include the following two models (a model 1 and a model 2).

Model 1: Increasing an inert gas flow velocity so as to increase the amount of oxygen removed by the volatilization of SiO, decreasing in oxygen concentration in the vicinity of a free surface of silicon melt. As a result, the amount of oxygen incorporated into a silicon single crystal is reduced.

Model 2: Causing melt in the vicinity of a free surface of silicon melt, where the oxygen concentration is by nature the lowest in the silicon melt, to be incorporated into a single crystal. It is inferred in this case that, when an inert gas flow velocity is increased, rolling convection directly below the single crystal growth meniscus is inhibited, which increases the oxygen concentration, and on the other hand, when the inert gas flow velocity is decreased, the rolling convection is promoted, which decreases the oxygen concentration.

In the case where the gap-to-crystal-diameter ratio is low (0.27 to 0.45), the oxygen concentration in a silicon single crystal can be reduced according to the model 1 (FIG. 2(b) corresponds to this, where the gap-to-crystal-diameter ratio=0.37). In other words, when the inert gas flow velocity is increased, the amount of oxygen removed by the volatilization increases, decreasing the oxygen concentration in the vicinity of the free surface of silicon melt.

On the other hand, in the case where the gap-to-crystal-diameter ratio is high (0.72 to 0.92), it is considered that the oxygen concentration in a silicon single crystal can be reduced according to the model 2 (FIG. 2(a) corresponds to this, where the gap-to-crystal-diameter ratio=0.86). In other words, when the inert gas flow velocity is increased, the oxygen concentration in the silicon single crystal increases because the rolling convection a is inhibited, and because a low inert gas flow velocity compared with the case where the gap-to-crystal-diameter ratio is low makes the action by the model 1 (the removal of SiO by an inert gas flow) difficult to exert, but when the inert gas flow velocity is decreased, the rolling convection is promoted, decreasing the oxygen concentration.

As described above, depending on the gap-to-crystal-diameter ratio, a positive or negative correlation are recognized between an inert gas flow velocity in a gap portion between the exterior surface of a single crystal and the lower-end opening edge of a heat shield, and the oxygen concentration in the silicon single crystal. The silicon single crystal producing method according to the present invention adjusts the flow velocity of inert gas at the gap portion between the heat shield and the single crystal (a crystal-inter-heat-shield gap portion) in accordance with the gap-to-crystal-diameter ratio, so as to control an oxygen concentration in a crystal.

Specifically, on pulling a silicon single crystal, the opening diameter of a heat shield necessary to grow a defect-free crystal is predetermined, and thus calculating a gap-to-crystal-diameter ratio corresponding to this opening diameter in advance gives a scheme for controlling the oxygen concentration through the adjustment of the inert gas flow velocity. In other words, using the value of the calculated gap-to-crystal-diameter ratio enables an appropriate and quick determination on whether the inert gas flow velocity should be increased or decreased in controlling the oxygen concentration.

In the silicon single crystal producing method according to the present invention, such an embodiment can be employed that increases the inert gas flow velocity at the gap portion between the single crystal and the heat shield (the crystal-inter-heat-shield gap portion) when the gap-to-crystal-diameter ratio is 0.27 to 0.45, so as to reduce the oxygen concentration in the crystal, and that decreases the inert gas flow velocity at the gap portion when the gap-to-crystal-diameter ratio is 0.72 to 0.92, so as to reduce the oxygen concentration in the crystal.

As described above, when the gap-to-crystal-diameter ratio is 0.27 to 0.45, there is a negative correlation between the inert gas flow velocity in the crystal-inter-heat-shield gap portion and the oxygen concentration in a crystal, and thus it is possible to reduce the oxygen concentration in a crystal by increasing the inert gas flow velocity. In contrast, when the gap-to-crystal-diameter ratio is 0.72 to 0.92, there is a positive correlation between the inert gas flow velocity and the oxygen concentration in a crystal, and thus it is possible to reduce the oxygen concentration in a crystal by decreasing the inert gas flow velocity.

In the silicon single crystal producing method according to the present invention, it is possible to appropriately control the oxygen concentration in a crystal by changing the inert gas flow velocity in accordance with a change in gap ratio attendant on the change in the diameter. This is particularly effective when the gap-to-crystal-diameter ratio is 0.27 to 0.45.

In the silicon single crystal producing method according to the present invention, such an embodiment can be employed that on pulling a single crystal, the flow velocity of inert gas at the crystal-inter-heat-shield gap portion is adjusted in stages of pulling, on the basis of the relation between the inert gas flow velocity in the gap portion calculated in advance in accordance with the gap-to-crystal-diameter ratio, and the oxygen concentration in a crystal.

When a single crystal is pulled, an oxygen concentration generally tends to be high on a top side and a bottom side. Thus, the relation between the inert gas flow velocity in the crystal-inter-heat-shield gap portion and the oxygen concentration in the crystal is calculated in advance in accordance with gap-to-crystal-diameter ratios (i.e., for each of various gap-to-crystal-diameter ratios), and on the basis of this relation, the flow velocity of inert gas is adjusted in stages in the pulling (i.e., at time points in the pulling), particularly at the beginning (the top side) and the end (the bottom side) in the pulling of the single crystal. It is thereby possible to eliminate the variations in oxygen concentration in a single crystal in a growth axis direction to ensure homogeneity, improving the yield.

In addition, according to the silicon single crystal producing method according to the present invention, it is possible to grow a silicon single crystal from which a large-diameter silicon wafer having a diameter of 300 mm or more can be cut.

EXAMPLES

Example 1

In consideration of the above-described result of study on the inert gas flow velocity through numerical simulations, for the cases where the gap-to-crystal-diameter ratio is low (0.37) and high (0.86), tests of pulling a silicon single crystal (having a crystal diameter of about 300 mm in both the cases) were conducted while changing an inert gas flow velocity at the gap portion between the exterior surface of a pulled single crystal and the lower-end opening edge of a heat shield (an Ar flow velocity in a crystal-heat shield space), and the concentration of oxygen incorporated into the single crystal was measured. Table 1 shows pulling test conditions together with the oxygen concentrations of the pulled single crystals.

The "Ar flow rate" is a flow rate of Ar gas introduced into the apparatus (volume velocity), which is measured as a volume of the Ar gas flowing per unit time at the standard temperature and pressure (0° C., 1 atmospheric pressure) in standard liters per minute (slpm), using a mass flow meter. On the basis of the "Ar flow rate" and the "atmospheric pressure in apparatus," the flow rate of Ar at the atmospheric pressure is calculated. Ignoring the influence of temperature on the volume of Ar, this flow rate of Ar at the atmospheric pressure can be considered as the flow rate of Ar in the apparatus. The "Ar flow velocity in crystal-heat shield space" (a linear velocity) is a velocity calculated from this flow rate of Ar in the apparatus and the area of a space between the crystal and the lower-end opening edge of the heat shield (an Ar gas passage).

In each test, a magnetic field in the range of 0.2 to 0.4 T (2091 to 4000 G) was applied, the pulled single crystal was rotated at 7.5 to 9.5 rpm, and the quartz crucible was rotated at 0.1 to 2.3 rpm.

In tests No. 8 to 15, crystal growth was performed at the gap-to-crystal-diameter ratio of the heat shield that is set higher than that in tests No. 1 to 7, which makes, as shown in Table 1, the gap-to-crystal-diameter ratio as high as 0.86 in the tests No. 8 to 15, while being 0.31 to 0.37 in the tests No. 1 to 7. The Ar flow velocity in the crystal-heat shield space was varied among the tests No. 1 to 7, and among the tests No. 8 to 15, by changing the Ar flow rate introduced into the apparatus.

TABLE 1

| Test No. | Oxygen concentration in crystal ($10^{17}$ atoms/cm$^3$) | Gap-to-crystal-diameter ratio | Ar flow rate (slpm) | Atmospheric pressure in apparatus (Torr) | Ar flow velocity in crystal-heat shield space (m/sec) |
|---|---|---|---|---|---|
| 1 | 15.7 | 0.31 | 150 | 70 | 1.14 |
| 2 | 12.65 | 0.37 | 300 | 30 | 4.64 |
| 3 | 12.54 | 0.37 | 301 | 30 | 4.66 |
| 4 | 13.22 | 0.37 | 220 | 30 | 3.39 |
| 5 | 14.11 | 0.37 | 151 | 30 | 2.34 |
| 6 | 14.43 | 0.37 | 151 | 30 | 2.34 |
| 7 | 13.8 | 0.37 | 151 | 30 | 2.34 |
| 8 | 13.63 | 0.86 | 219 | 30 | 1.44 |
| 9 | 14.64 | 0.86 | 301 | 30 | 1.98 |
| 10 | 13.97 | 0.86 | 301 | 30 | 1.98 |
| 11 | 14.14 | 0.86 | 301 | 30 | 1.98 |
| 12 | 12.9 | 0.86 | 151 | 30 | 0.99 |
| 13 | 13.01 | 0.86 | 151 | 30 | 1.00 |
| 14 | 12.3 | 0.86 | 151 | 30 | 1.00 |
| 15 | 12.04 | 0.86 | 151 | 30 | 0.85 |

FIG. 3 is based on the test results shown in Table 1, being a diagram illustrating the relation between the Ar flow velocity in the crystal-heat shield (the lower-end opening edge) space and the oxygen concentration in a pulled single crystal. In FIG. 3, the case where the gap-to-crystal-diameter ratio is set low (0.31 to 0.37) is written as "GAP-TO-CRYSTAL-DIAMETER RATIO: LOW", and the case where the gap-to-crystal-diameter ratio is set high (0.86) is written as "GAP-TO-CRYSTAL-DIAMETER RATIO: HIGH".

As is clear from FIG. 3, it was found that there is a negative correlation between the Ar flow velocity and the oxygen concentration in a pulled single crystal when the gap-to-crystal-diameter ratio of the heat shield is low, and there is a positive correlation when the gap-to-crystal-diameter ratio of the heat shield is high. In other words, to reduce the oxygen concentration in a pulled single crystal, the Ar flow velocity in the crystal-heat shield space has to be increased when the gap-to-crystal-diameter ratio is 0.31 to 0.37 and has to be decreased when the gap-to-crystal-diameter ratio is 0.86.

From the above result, it was confirmed that an oxygen concentration in a crystal can be controlled by adjusting, for example, the flow rate of inert gas introduced into the apparatus in accordance with the gap-to-crystal-diameter ratio to adjust the flow velocity of inert gas in the crystal-heat shield space.

Example 2

For each of the cases where the gap-to-crystal-diameter ratio of the heat shield is low and high, the relation between the gap-to-crystal-diameter ratio and the oxygen concentration in a pulled single crystal was investigated while changing the gap-to-crystal-diameter ratio by changing the diameter of the silicon single crystal. The flow rate of inert gas (Ar gas) introduced into the apparatus and the pressure in the apparatus were set constant.

Figure 4:
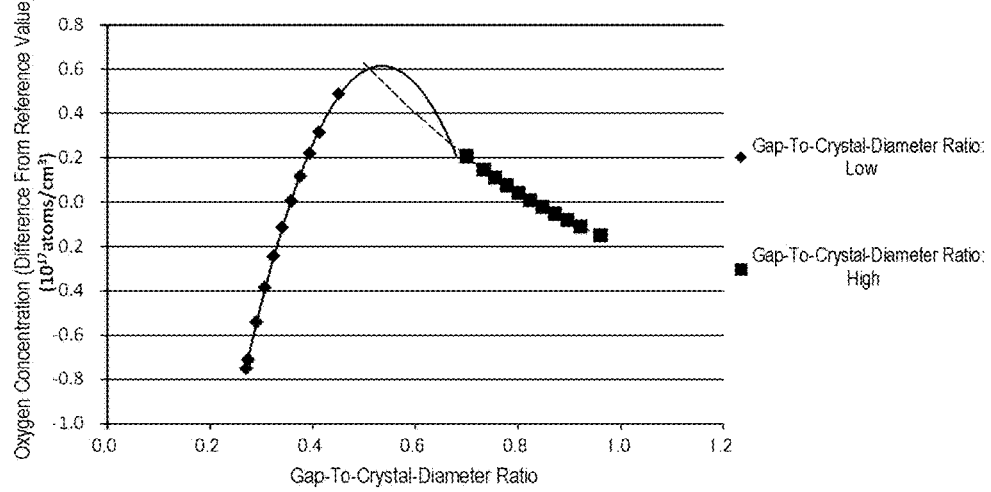
FIG. 4 is a diagram illustrating a relation between the gap-to-crystal-diameter ratio and the oxygen concentration in the pulled single crystal.

The result is shown in FIG. 4. FIG. 4 is a diagram illustrating the relation between the gap-to-crystal-diameter ratio and the oxygen concentration in a pulled single crystal for the cases where the gap-to-crystal-diameter ratio of the heat shield is high and low.

As is clear from FIG. 4, in the case where the gap-to-crystal-diameter ratio of the heat shield is low (written in FIG. 4 as "GAP-TO-CRYSTAL-DIAMETER RATIO: LOW"), the oxygen concentration in a pulled single crystal is reduced as the crystal diameter is increased, and in the case where the gap-to-crystal-diameter ratio of the heat shield is high (written in FIG. 4 as "GAP-TO-CRYSTAL-DIAMETER RATIO: HIGH"), the oxygen concentration in a pulled single crystal is increased as the crystal diameter is increased.

Since the flow rate of Ar gas introduced into the apparatus was set constant, in comparison for the same heat shield, the Ar flow velocity in the crystal-heat shield (the lower-end opening edge) space is decreased as the gap-to-crystal-diameter ratio is increased.

As is clear from the result shown in FIG. 4, when the gap-to-crystal-diameter ratio is in the range of 0.72 to 0.92, the oxygen concentration in a pulled single crystal less fluctuates with the changes in gap-to-crystal-diameter ratio, as compared with when the gap-to-crystal-diameter ratio is in the range of 0.27 to 0.45. In other words, growing a single crystal at a gap-to-crystal-diameter ratio in the range of 0.72 to 0.92 is robust in terms of oxygen concentration in a crystal against external perturbations, in particular diameter fluctuations (the changes in gap-to-crystal-diameter ratio), as compared with growing the single crystal at a gap-to-crystal-diameter ratio in the range of 0.27 to 0.45.

The growing a single crystal at a gap-to-crystal-diameter ratio in the range of 0.27 to 0.45 is susceptible in terms of setting the oxygen concentration in a crystal constant to external perturbations, in particular diameter fluctuations (the changes in gap-to-crystal-diameter ratio) as compared with the growing the single crystal at a gap-to-crystal-diameter ratio in the range of 0.72 to 0.92, but by controlling the flow rate of Ar gas introduced into the apparatus in accordance with the diameter fluctuations, it is possible to reduce the influence of the external perturbations, obtaining a single crystal having a uniform oxygen concentration.

Summarizing the result shown in FIG. 3 and the result shown in FIG. 4, it is considered that, at a gap-to-crystal-diameter ratio ranging from 0.27 to 0.45, the oxygen concentration in a pulled single crystal is reduced as the Ar flow velocity in the crystal-heat shield space is increased, and at a gap-to-crystal-diameter ratio ranging from 0.72 to 0.92, the oxygen concentration in a pulled single crystal is increased as the Ar flow velocity in the crystal-heat shield space is increased.

INDUSTRIAL APPLICABILITY

According to the silicon single crystal producing method according to the present invention, it is possible to appropriately (easily and stably) perform control of an oxygen concentration in silicon single crystal. Therefore, the present invention is widely applicable to producing a silicon single crystal from which a silicon wafer (for producing a semiconductor device) is cut.

REFERENCE SIGNS LIST

1: chamber, 2: support shaft, 3: susceptor,
4: quartz crucible, 5: heater, 6: insulator, 7: seed holder,
8: pulling wire, 9: silicon single crystal, 10: silicon melt,
11: forced cooling member, 12: heat shield, 12a: side portion of heat shield,
12b: lower-end of heat shield, 13: magnetic field applying device,
14: gas inlet, 15: gas outlet

The invention claimed is:

1. A method for producing a silicon single crystal by the Czochralski method using a single crystal pulling apparatus in which a heat shield is disposed around a silicon single crystal, which is being pulled, so as to be concentric with a pulling axis, wherein
   an oxygen concentration in the crystal is controlled through adjustment, in accordance with a gap-to-crystal-diameter ratio, of a flow velocity of inert gas introduced into the single crystal pulling apparatus at a gap portion between an exterior surface of the single crystal and a lower-end opening edge of the heat shield, the gap-to-crystal-diameter ratio being obtained by dividing an area of the gap portion by an area of a cross section perpendicular to the pulling axis of the single crystal.

2. The silicon single crystal producing method according to claim 1, wherein
   the oxygen concentration in the crystal is controlled through flow velocity adjustment of the inert gas, on the basis that
   when the gap-to-crystal-diameter ratio is 0.27 to 0.45, an inert gas flow velocity at the gap portion between the single crystal and the heat shield, and the oxygen concentration in the crystal have a negative correlation, and
   when the gap-to-crystal-diameter ratio is 0.72 to 0.92, the inert gas flow velocity at the gap portion and the oxygen concentration in the crystal have a positive correlation.

3. The silicon single crystal producing method according to claim 1, wherein
   when the single crystal is pulled,
   the oxygen concentration in the crystal is controlled through adjustment of a flow velocity of inert gas at the gap portion performed in stages in the pulling on the basis of a relation between the inert gas flow velocity at the gap portion that is calculated in advance in accordance with the gap-to-crystal-diameter ratio, and the oxygen concentration in the crystal.

4. The silicon single crystal producing method according to claim 2, wherein
   the oxygen concentration in the crystal is controlled through adjustment of the flow velocity of inert gas introduced into the single crystal pulling apparatus in accordance with a diameter fluctuation of the crystal.

5. The silicon single crystal producing method according to claim 1, wherein
   the silicon single crystal to be grown has such a diameter that enables a silicon wafer having a diameter of 300 mm or more to be cut.

6. The silicon single crystal producing method according to claim 3, wherein
   the oxygen concentration in the crystal is controlled through adjustment of the flow velocity of inert gas introduced into the single crystal pulling apparatus in accordance with a diameter fluctuation of the crystal.

* * * * *